United States Patent
Wright

(10) Patent No.: US 8,330,038 B1
(45) Date of Patent: Dec. 11, 2012

(54) RADIUM POWER PACK AND SYSTEM FOR GENERATING POWER

(76) Inventor: Ronnie H. Wright, Greenbrier, AR (US)

( * ) Notice: Subject to any disclaimer, the term of this patent is extended or adjusted under 35 U.S.C. 154(b) by 0 days.

(21) Appl. No.: 13/331,629

(22) Filed: Dec. 20, 2011

(51) Int. Cl.
*H01L 31/00* (2006.01)
*H01M 14/00* (2006.01)

(52) U.S. Cl. .......................................... 136/253; 429/5

(58) Field of Classification Search .................. 136/243, 136/244, 247, 251, 252, 254, 257, 253; 429/5
See application file for complete search history.

(56) References Cited

U.S. PATENT DOCUMENTS

| | | | |
|---|---|---|---|
| 4,571,447 A * | 2/1986 | Prins | 136/252 |
| 4,923,747 A * | 5/1990 | McCullough et al. | 428/312.6 |
| 4,997,597 A * | 3/1991 | Clough et al. | 252/646 |
| 5,082,505 A * | 1/1992 | Cota et al. | 136/253 |
| 5,235,232 A | 8/1993 | Conley et al. | |
| 5,260,621 A * | 11/1993 | Little et al. | 310/303 |
| 5,340,954 A * | 8/1994 | Hoffman et al. | 200/277.2 |
| 5,859,484 A * | 1/1999 | Mannik et al. | 310/303 |
| 7,488,889 B2 | 2/2009 | Putnam | |
| 7,718,283 B2 | 5/2010 | Raffaelle et al. | |
| 2002/0121299 A1* | 9/2002 | Vaz | 136/253 |
| 2002/0134424 A1* | 9/2002 | Vaz | 136/247 |
| 2006/0072271 A1* | 4/2006 | Jones et al. | 361/93.1 |
| 2006/0225781 A1* | 10/2006 | Locher | 136/245 |
| 2006/0254639 A1* | 11/2006 | Idota | 136/263 |
| 2008/0245407 A1 | 10/2008 | Jackson | |
| 2009/0020153 A1* | 1/2009 | Sung | 136/255 |
| 2011/0126889 A1* | 6/2011 | Bourke et al. | 136/253 |

FOREIGN PATENT DOCUMENTS

| | | |
|---|---|---|
| WO | 9936967 A1 | 7/1999 |
| WO | WO 99/36967 * | 7/1999 |

OTHER PUBLICATIONS

Kilko et al, Defects in beryllium Ceramics, Science for Ceramic Production, vol. 56, Nos. 11-12, pp. 346-349, (1999).*
Richard J. Lewis, Sr. "Hawley's Condensed Chemical Dictionary, 13th Edition", John Wiley & Sons, Inc., New York pp. 713, 907, 908, and 991 (1997).*
Harris, "Quantitative Chemical Analysis, 3rd Edition", W. H. Freeman and Company, New York, pp. 551-552 (1991).*
Gager, "Effects on the Rays of Radium on Plants", The New Era Printinng Company, Lancaster, Pa, pp. 12 (1908).*
R. Westervelt, Power Sources for Ultra Low Power Electronics, Jun. 2000, The MITRE Corporation, United States.

* cited by examiner

*Primary Examiner* — Alexander Kollias
(74) *Attorney, Agent, or Firm* — Richard Blakely Glasgow

(57) ABSTRACT

A power pack comprising a solar cell panel, a carbon crystal plate, and a radium plate, wherein said solar cell panel, said carbon crystal plate, and said radium plate are positioned in an encasement. A system for generating power utilizing the power pack is also disclosed.

6 Claims, 2 Drawing Sheets

RADIUM POWER PACK AND SYSTEM FOR GENERATING POWER

CROSS-REFERENCE TO RELATED APPLICATIONS

Not applicable

STATEMENT REGARDING FEDERALLY SPONSORED RESEARCH OR DEVELOPMENT

Not applicable

BACKGROUND OF THE INVENTION

This invention relates to an energy pack and, more particularly, to a radium power pack for use as an alternate energy source.

Radium is an earth metal and all isotopes of radium are radioactive. It has a half-life of approximately 1600 years. Radium is known to be luminescent and was formerly used in self-luminous paints for watches and clocks.

Alternative energy sources for powering appliances and other electronics in and around the home are well-known, such as gas and solar generators. These alternative energy sources have become popular because they can be used for power in the event of power loss in the home or other emergency situation. These alternative energy sources, however, are dependent on gas (in the case of the gas generator) and sunlight (in the case of the solar generator), which causes these alternative energy sources to be severely time-limited in effectiveness.

It would therefore be desirable to develop a power pack for use as an alternative energy source that is capable of providing long-lasting energy.

BRIEF SUMMARY OF THE INVENTION

The present invention is comprised of a power pack comprising a solar cell panel; a first plate, wherein said first plate is comprised of radium; and a second plate, wherein said second plate is a carbon crystal plate; said solar cell panel, said first plate, and said second plate positioned in an encasement.

The present invention is also comprised of a system for generating power comprising a first plate comprised of radium, wherein light is emitted from said first plate; a second plate, wherein said second plate is a carbon crystal plate and wherein said light passes through said carbon crystal plate; and a solar cell panel, wherein said light is received by said solar cell panel and said solar cell panel converts the energy from said light to electrical energy.

These and other features, objects and advantages of the present invention will become better understood from a consideration of the following detailed description of the preferred embodiments and appended claims in conjunction with the drawings as described following:

DETAILED DESCRIPTION OF THE INVENTION

Figure 1:
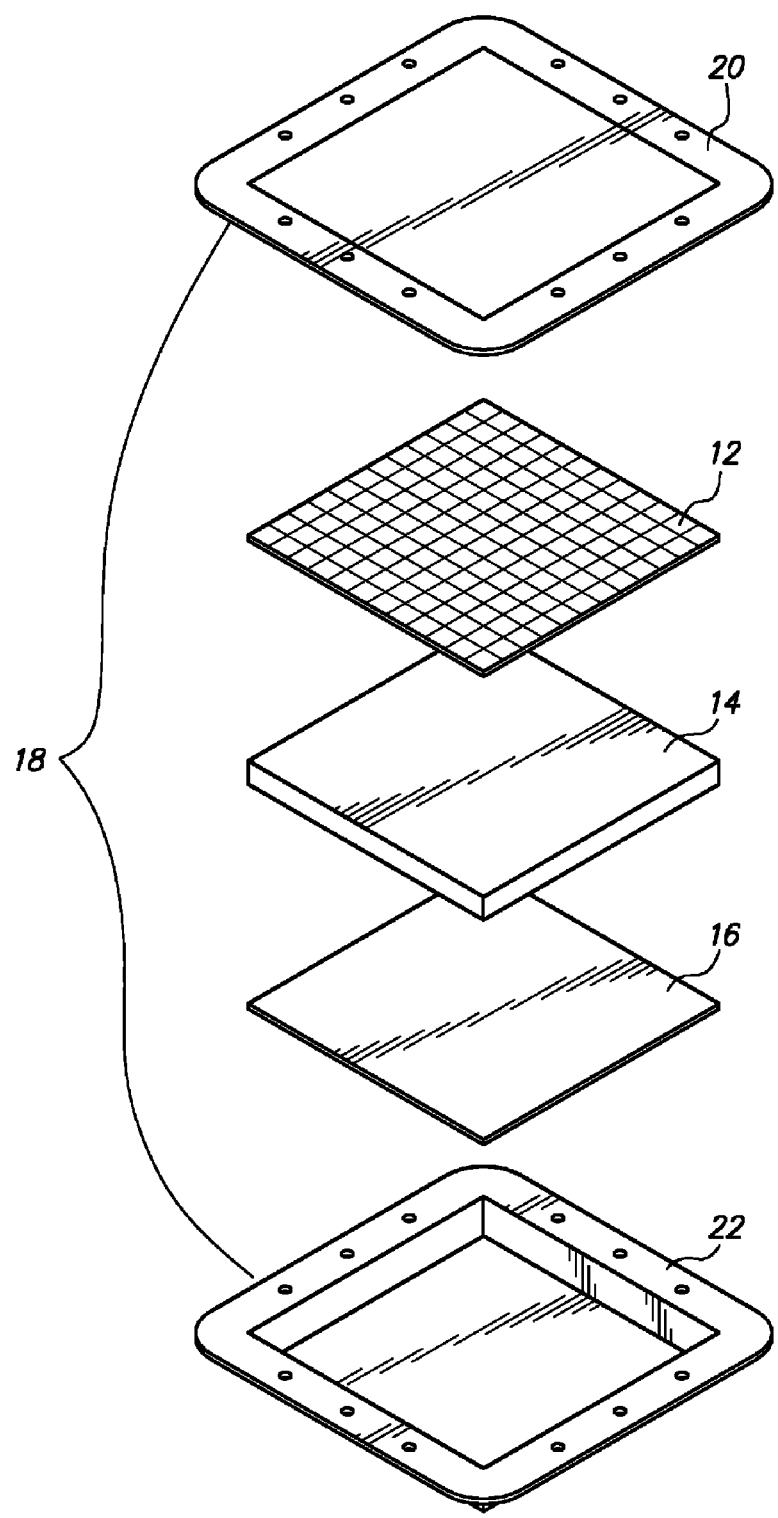
FIG. 1 is an exploded view of the power pack.
Figure 2:
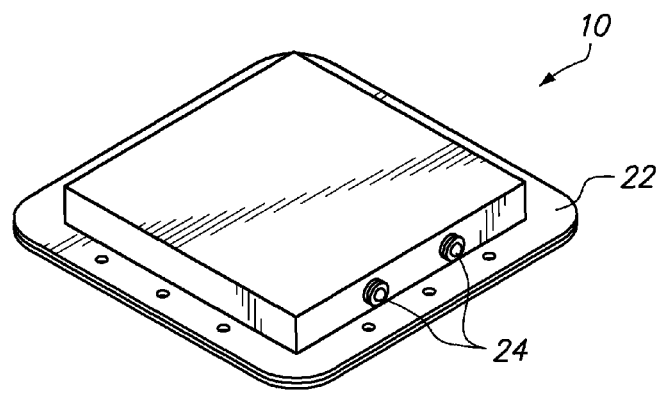
FIG. 2 is a perspective view of the bottom of the power pack.
Figure 3:
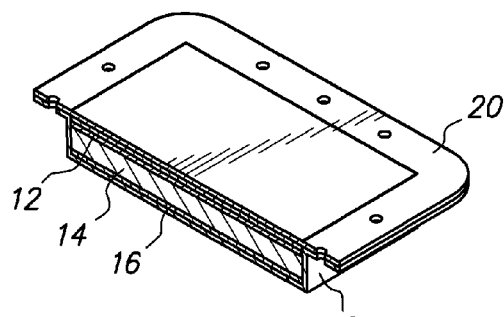
FIG. 3 is a sectional view of the power pack.
Figure 4:
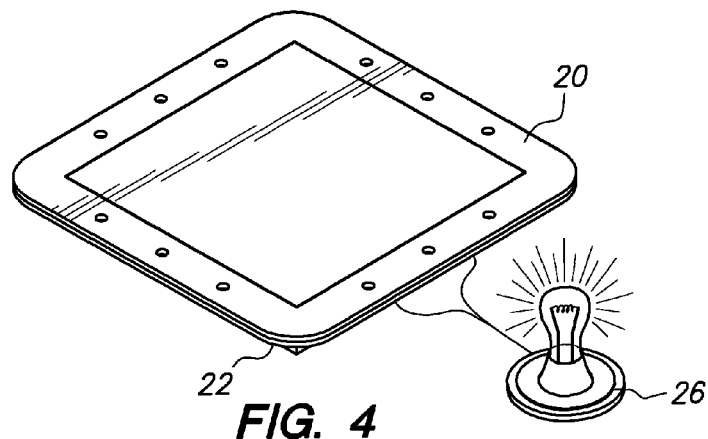
FIG. 4 is a perspective view of the top of the power pack.

The power pack 10 is comprised of a solar cell panel 12, a carbon crystal plate 14, a radium plate 16, and an encasement 18.

The carbon crystal plate 14 is positioned between the solar cell panel 12 and radium plate 16. Light can be transmitted through the carbon crystal plate 14. Carbon crystal plate 14 preferably is a diamond carbon crystal plate.

The radium plate 16 is positioned adjacent to the carbon crystal plate 14. The radium plate 16 is comprised of melted concentrated radium. As characteristic of radium, the radium plate emits light.

A cyclotron separator containing radium yields the concentrated radium that comprises the radium plate 16. The greater the revolutions per minute (RPM) of the cyclotron separator, the greater the concentration of radium. The candlelight power of the radium is directly dependent on the concentration of radium. In other words, the greater the concentration of radium, the greater the candlelight power of the radium.

The solar cell panel 12, also known as a photovoltaic cell, is positioned adjacent to the carbon crystal plate 14. The solar cell panel 12, which is of the type well-known to those skilled in the art, is an electric device that converts light energy into electricity based on the photovoltaic effect.

The encasement 18 is comprised of a top plate 20 and a bottom plate 22. The top plate 20 and bottom plate 22 are comprised of ceramic material and beryllium. The beryllium comprises the outside surface of the top plate 20 and bottom plate 22. The ceramic material is attached to the beryllium and comprises the inside surface of the top plate 20 and bottom plate 22. Because of their composition, the inventor believes that top plate 20 and bottom plate 22 is effective to shield and absorb the radiation emitted from the radium plate 16. The top plate 20 and bottom plate 22 fully encases the radium plate 16, carbon crystal plate 14, and solar cell panel 12.

The light emitted from the radium plate 16 passes through the carbon crystal plate 14 and is received by the solar cell panel 12. The solar cell panel 12 converts the light energy to electricity. The greater the light energy emitted from the radium plate 16, the more electricity produced by the power pack 10.

The power pack 10 is preferably six inches in length, six inches in height, and one inch in width. The relatively small size of the power pack 10 makes it easily transportable. In one embodiment, the power pack 10 supplies DC power. In that embodiment, the encasement 18 comprises a positive and negative terminal 24, and accompanying lead wires for transferring power to an electric-powered device, such as a lighting device 26. In another embodiment, the power pack 10 is capable of supplying AC power and the encasement 18 comprises one or more two- or three-prong electrical outlets for plugging in electric-powered devices to the radium power pack 10. Though the connection between the radium power pack 10 and the electric-powered device, sufficient electricity is transferred from the radium power pack 10 to power the electric-powered device.

The present invention has been described with reference to certain preferred and alternative embodiments that are intended to be exemplary only and not limiting to the full scope of the present invention as set forth in the appended claims.

I claim:
1. A power pack comprising:
(a) a solar cell panel;
(b) a first plate, wherein said first plate consists of radium;

(c) a second plate, wherein said second plate is a diamond plate, wherein said second plate is positioned between said solar cell panel and said first plate; and (d) an encasement comprising a top plate and a bottom plate, wherein outside surfaces of both said top and bottom plates consist of beryllium, and wherein inside surfaces of both said bottom and top plates consist of ceramic material;

wherein said solar cell panel, said first plate, and said second plate are positioned in said encasement.

2. The power pack of claim 1, wherein said beryllium and ceramic material are effective to shield and absorb radiation.

3. The power pack of claim 1, wherein said solar cell panel, said first plate, and said second plate are completely encased by said top plate and said bottom plate.

4. The power pack of claim 1 further comprising at least one two-prong electrical outlet.

5. The power pack of claim 1 further comprising at least one three-prong electrical outlet.

6. The power pack of claim 1 further comprising a positive and negative terminal.

* * * * *